United States Patent [19]
Pfiester

[11] Patent Number: 5,182,619
[45] Date of Patent: Jan. 26, 1993

[54] SEMICONDUCTOR DEVICE HAVING AN MOS TRANSISTOR WITH OVERLAPPED AND ELEVATED SOURCE AND DRAIN

[75] Inventor: James R. Pfiester, Austin, Tex.

[73] Assignee: Motorola, Inc., Schaumburg, Ill.

[21] Appl. No.: 753,500

[22] Filed: Sep. 3, 1991

[51] Int. Cl.$^5$ .................... H01L 29/78; H01L 27/02; H01L 23/48
[52] U.S. Cl. .................... 257/382; 257/344; 257/401; 257/408; 257/900
[58] Field of Search .................... 357/23.3, 23.4, 675, 357/715, 596, 23.9

[56] References Cited

U.S. PATENT DOCUMENTS

| | | | |
|---|---|---|---|
| 4,506,437 | 3/1985 | Godejahn, Jr. | 357/596 |
| 4,700,215 | 10/1987 | McPherson | 357/596 |
| 4,808,544 | 2/1989 | Matsui | 357/23.3 |
| 4,885,617 | 12/1989 | Mazure-Espejo et al. | 357/23.9 |
| 4,929,992 | 5/1990 | Thomas et al. | 357/67 S |
| 4,931,408 | 6/1990 | Hshieh | 357/23.4 |
| 4,970,567 | 11/1990 | Ahlgren et al. | 357/24 LR |
| 4,994,873 | 2/1991 | Madan | 357/23.4 |
| 5,028,976 | 7/1991 | Ozaki et al. | 357/42 |
| 5,061,647 | 10/1991 | Roth et al. | 437/40 |

OTHER PUBLICATIONS

"A Novel Submicron LDD Transistor with Inverse-T Gate Structure," by T. Huang et al., Technical Digest of the International Electron Devices Meeting, 1986, article 31.7, pp. 742-745.

"Elevated Source/Drain MOSFET," by S. Wong et al., Technical Digest of the International Electron Devices Meeting, 1984, article 28.4, pp. 634-637.

Primary Examiner—Paul M. Dzierzynski
Assistant Examiner—Michael B. Shingleton
Attorney, Agent, or Firm—Patricia S. Goddard

[57] ABSTRACT

Source and drain electrodes which are overlapped and elevated with respect to an inverse-T gate electrode provide low lateral electric field, low source-drain series resistance, and uniform source and drain doping profiles while maintaining a compact layout. In one form of the invention, a semiconductor device (10) has source and drain electrodes (40) which are elevated and overlap shelf portions (21) of an inverse-T gate electrode (19). LDD regions (28) are formed in a substrate (12) and partially underlie the gate electrode. Facets (41) of the selectively deposited source and drain electrodes overlie the shelf portions of the gate electrode, thereby creating uniform doping profiles of heavily doped regions (42).

13 Claims, 4 Drawing Sheets

SEMICONDUCTOR DEVICE HAVING AN MOS TRANSISTOR WITH OVERLAPPED AND ELEVATED SOURCE AND DRAIN

CROSS-REFERENCE TO RELATED APPLICATION

This application is related, in part, to a commonly assigned, co-pending patent application by Roth et al., entitled, "ITLDD Transistor Having Variable Work Function and Method for Fabricating the Same," Ser. No. 07/597,946, filed on Oct. 12, 1990, now U.S. Pat. No. 5,061,647, issued on Oct. 29, 1991.

FIELD OF THE INVENTION

The present invention relates to semiconductor devices in general, and more specifically to semiconductor devices having MOS (metal-oxide-semiconductor) transistors with source and drain electrodes which are both elevated and overlapped with respect to a gate electrode.

BACKGROUND OF THE INVENTION

Traditional MOS transistors in semiconductor devices utilize a gate electrode formed over a semiconductor substrate and separated from the substrate by a thin gate dielectric layer. Source and drain electrodes of the transistor are formed by implanting a high dose of impurity atoms into the substrate on each side of the gate electrode and subsequently contacting the implanted regions with a conductive layer which is electrically isolated from the gate electrode. While these traditional MOS transistors found much success in the semiconductor industry, device limitations became apparent as transistor size was reduced. In particular, high electric fields in the substrate often caused undesirable hot carrier injection into the gate dielectric layer. Trapped charge in the dielectric layer as a result of hot carrier injection will negatively impact a transistor's electrical characteristics, particularly over an extended period of time.

To overcome some of the problems associated with hot carrier injection, many semiconductor manufacturers started to form MOS transistors with LDD (lightly doped drain) regions. One way of fabricating LDD MOS transistors is to form a gate electrode over a semiconductor substrate, where the gate electrode and substrate are separated by a thin gate dielectric layer. A low dose of impurity atoms is implanted in the substrate on each side of the gate electrode, forming two LDD regions. Sidewall spacers are formed along sides of the gate electrode to offset a high dose implant. The high dose implant forms source and drain electrodes of the transistor in the substrate such that the source and drain are offset from the gate by a distance approximately equal to the width of the sidewall spacer. In having the source and drain offset from the gate and in having the LDD regions formed in the substrate, the depletion distance (the width of the depletion layer between the source or the drain and the channel) is increased, thereby lowering the electric field in the portion of the substrate between the two LDD regions, also known as the channel region. A decrease in the lateral electric field in the channel region suppresses hot carrier effects and also reduces current in the substrate, thus LDD MOS transistors were considered an improvement over the traditional MOS transistors described earlier. LDD MOS transistors, however, have a disadvantage in that the LDD regions create an increase in source-drain series resistance in the transistor in comparison to traditional MOS transistors. An increase in series resistance is caused by trapped charge at an interface between an LDD region and a dielectric sidewall spacer, resulting in depleted LDD regions.

Another known structure, an ITLDD (inverse-T LDD) MOS transistor, provides lower electric fields in the channel region and lower substrate current in comparison to traditional MOS transistors. Furthermore, ITLDD transistors have reduced series resistance in comparison to other LDD transistors. ITLDD transistors utilize an inverted T-shaped gate electrode formed over a semiconductor substrate. LDD regions are formed in the substrate beneath the wings or shelves of the T-shaped gate. Source and drain electrodes are formed by a high dose implant of impurity atoms into the substrate and are aligned to the shelf edges. Because the LDD regions are beneath the shelf portions of the gate electrode, as opposed to being aligned to gate edges, the gate electrode can modulate any trapped charge in the LDD regions to prevent depletion, thereby minimizing source-drain series resistance. ITLDD transistors, however, have a significant disadvantage with respect to transistor size. The shape of an ITLDD gate electrode necessitates a gate length which is larger than a channel length in the substrate. In an industry which is continually driven to reduce device size, it is important to minimize the size of transistors used in semiconductor devices. ITLDD structures are, therefore, unfavorable since use of ITLDD transistors is in a direction which is opposite that of demand.

A need, therefore, exists for an improved semiconductor device, and more particularly for an improved semiconductor device having MOS transistors and process for making the same which provides a low lateral electric field in a channel region of the transistor, which provides low substrate current, and which occupies a minimal amount of space in the semiconductor device.

SUMMARY OF THE INVENTION

The previously mentioned need is fulfilled and other advantages are achieved with the present invention. In one embodiment of the invention, a semiconductor device has an MOS transistor with overlapped and elevated source and drain electrodes. More specifically, the device has an inverse-T gate electrode having a body portion and first and second shelf portions. The gate electrode is formed over a semiconductor substrate, being separated from the substrate by a gate dielectric. First and second lightly doped regions of a first conductivity are formed in the substrate on opposing sides of the gate electrode. An elevated source electrode of the first conductivity is formed on the first lightly doped region and overlies the first shelf portion of the gate electrode. An elevated drain electrode of the first conductivity is formed on the second lightly doped region and overlies the second shelf portion of the gate electrode. A dielectric separates the elevated source and drain electrodes from the inverse-T gate electrode.

These and other features, and advantages, will be more clearly understood from the following detailed description taken in conjunction with the accompanying drawings. It is important to note that the drawings are not necessarily drawn to scale and should not be interpreted as the only approach to practicing the invention.

DETAILED DESCRIPTION OF A PREFERRED EMBODIMENT

The present invention overcomes the disadvantages of existing MOS transistors set forth previously. A semiconductor device in accordance with the present invention provides a low lateral electric field in a transistor's channel region by using low dose LDD regions. Utilizing low dose LDD regions also establishes desirably low substrate currents. A device formed in accordance with the present invention has an inverse-T gate electrode, yet is not restricted in size by gate length, or more particularly by shelf dimension (illustrated below), as are existing inverse-T structures. Source and drain electrodes of the MOS transistor in the present invention extend over shelf portions of the inverse-T gate electrode, resulting in a more compact transistor layout. These and other features of the present invention are illustrated in FIGS. 1-11, which are cross-sectional illustrations depicting a method for forming a semiconductor device having an MOS transistor in accordance with the invention.

Figure 1:
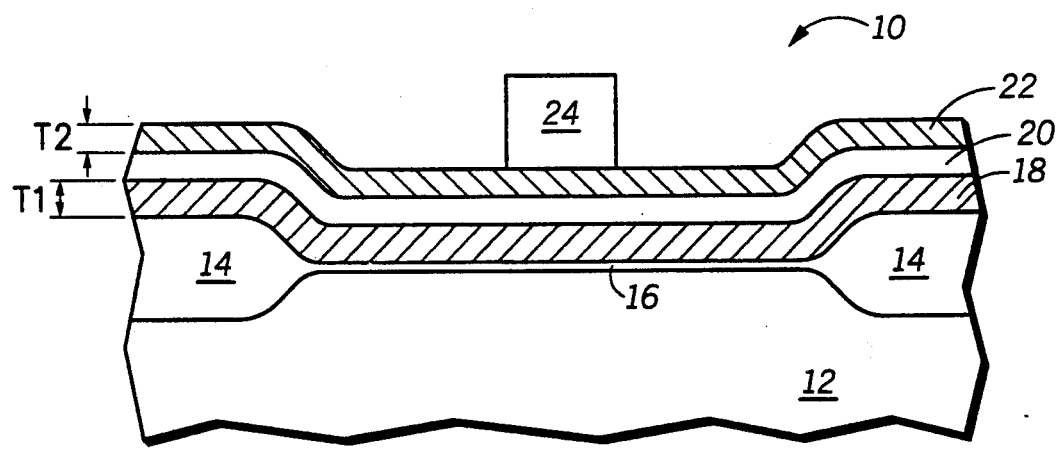
FIGS. 1-11 are a series of cross-sectional illustrations of a portion of a semiconductor device depicting a process for fabricating an MOS transistor, in accordance with the present invention.

As illustrated in FIG. 1, a semiconductor device 10 is fabricated by providing a semiconductor substrate 12. Substrate 12 is formed on any of the commonly used substrate materials including silicon, gallium arsenide, or the like. Substrate 12 is usually lightly doped with a P-type impurity in the instance of fabricating an N-channel transistor or with an N-type impurity in the instance of fabricating a P-channel transistor. Both N-channel and P-channel transistors may be formed in accordance with the present invention. Field oxide regions 14, also referred to as isolation regions, are formed in a conventional manner within the device and usually are formed of $SiO_2$. A gate dielectric 16, also usually of $SiO_2$, is formed on substrate 12 between field oxide regions 14. Gate dielectric 16 is typically grown by thermally oxidizing an underlying silicon substrate and is most often on the order of 50-200 Å (5-20 nm).

Overlying substrate 12 is a conductive layer 18. Conductive layer 18 is eventually patterned into a gate electrode, as will be described and illustrated below, and is therefore formed of a material commonly used as a gate electrode, such as polysilicon. As an example, conductive layer 18 may be suitably deposited to a thickness on the order of 3000 Å (300 nm). Conductive layer 18 also may be doped, if a doped gate electrode is desired. An insulating layer 20 is formed on conductive layer 18. Insulating layer 20 will eventually serve to electrically isolate a top surface of the gate electrode formed from conductive layer 18 from subsequently deposited conductive layers. Accordingly, conductive layer 18 should be sufficiently thick to provide adequate isolation. A thickness on the order of 2000 Å (200 nm) is acceptable. Suitable materials for insulating layer 20 are TEOS (tetra-ethyl-ortho-silicate), $SiO_2$, $Si_3N_4$, or the like. A layer of material 22 is formed on insulating layer 20. In selecting a material for layer of material 22, it is important that the material has the same etch rate as the material chosen for conductive layer 18 for a given etch chemistry, for reasons to become evident below. Preferably, layer of material 22 is of the same material as conductive layer 18 to assure the etch rates of the two materials are equal. The thickness of layer of material 22 is less than that of conductive layer 18, and is further determined by dimensions of the gate electrode to be formed, as will become apparent in the discussion of FIG. 3. As an example, if conductive layer 18 is approximately 3000 Å (300 nm), layer of material 22 may be on the order of 2750 Å (275 nm).

Figure 2:
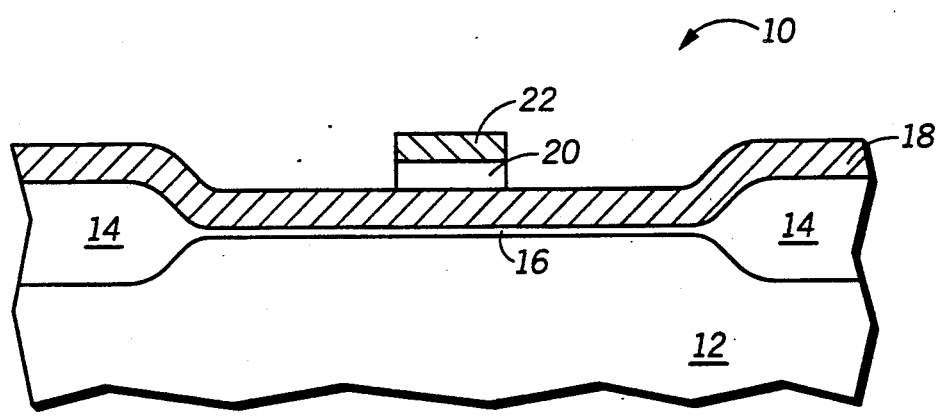

FIG. 1 also illustrates a mask 24, for example a photoresist mask, formed above layer of material 22. Mask 24 protects portions of the underlying layers from being etched. As illustrated in FIG. 2, device 10 is etched such that unmasked portions of layer of material 22 and insulating layer 20 are removed. In removing portions of layer of material 22 and insulating layer 20, conductive layer 18 is left substantially unaltered. Leaving conductive layer 18 unaffected can be accomplished by using a series of selective etches or by using an etch system which has end point detection. After removing portions of layer of material 22 and insulating layer 20, mask 24 is removed from the device. Removing mask 24 results in a stacked composite structure of layer of material 22 and insulating layer 20, as FIG. 2 illustrates.

Figure 3:
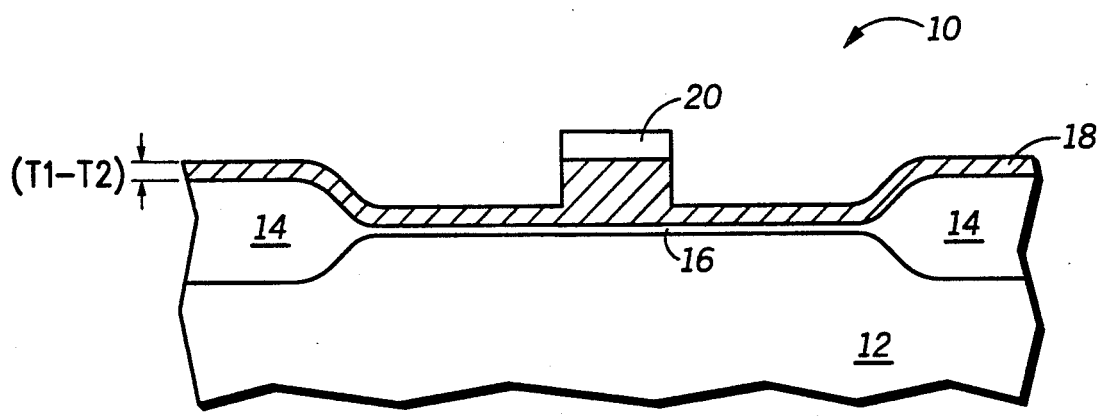

The composite structure illustrated in FIG. 2 is used as a mask in etching conductive layer 18. In etching conductive layer 18, remaining portions of layer of material 22 are also removed at the same rate as unmasked portions of conductive layer 18. Etching is terminated once layer of material 22 is entirely removed from the device, as illustrated in FIG. 3. Because conductive layer 18 is thicker than layer of material 22, the conductive layer is not completely removed in unmasked portions of the device. As an example, conductive layer 18 has an original thickness T1 and layer of material 22 has an original thickness of T2, where T1 is greater than T2. In removing layer of material 22 from the composite mask illustrated in FIG. 2, unmasked portions of device 10 will have a conductive layer thickness of (T1−T2) since the layer of material 22 is removed at the same rate as conductive material 18. Masked portions of conductive layer 18, i.e. portions beneath the remainder of insulating layer 20, maintain the original thickness of T1, as FIG. 3 illustrates.

Figure 4:
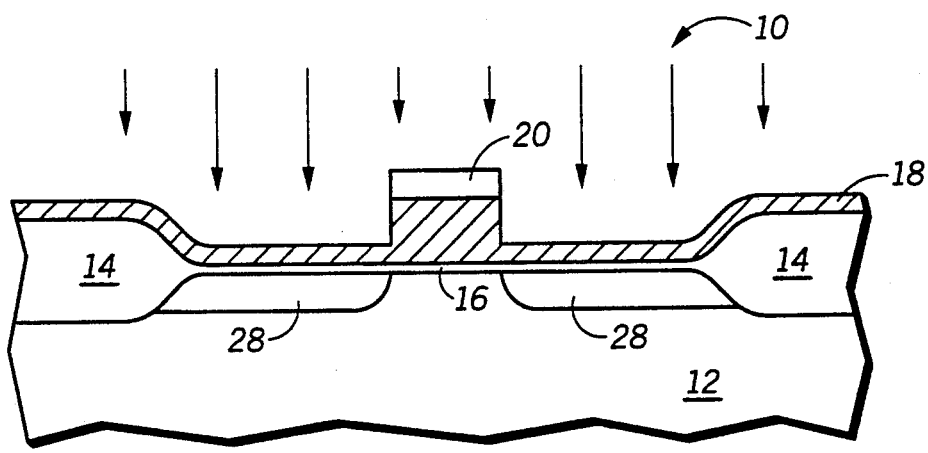

After etching conductive layer 18, device 10 is implanted with a light dose of impurity atoms to form LDD (lightly doped drain) regions 28, as illustrated in FIG. 4. It is worth noting that although one of the two LDD regions is actually a lightly doped source, both regions are commonly referred to as LDD regions. In making an N-channel transistor, the impurity implant is an N-type dopant species, while a P-channel transistor requires a P-type dopant species. Dosages suitable for forming LDD regions 28 are comparable to those used in known LDD structures.

Figure 5:
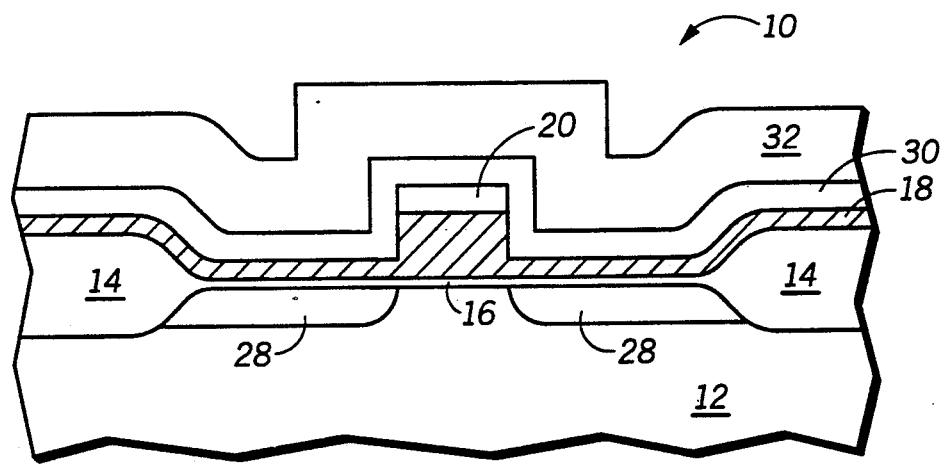
Figure 6:
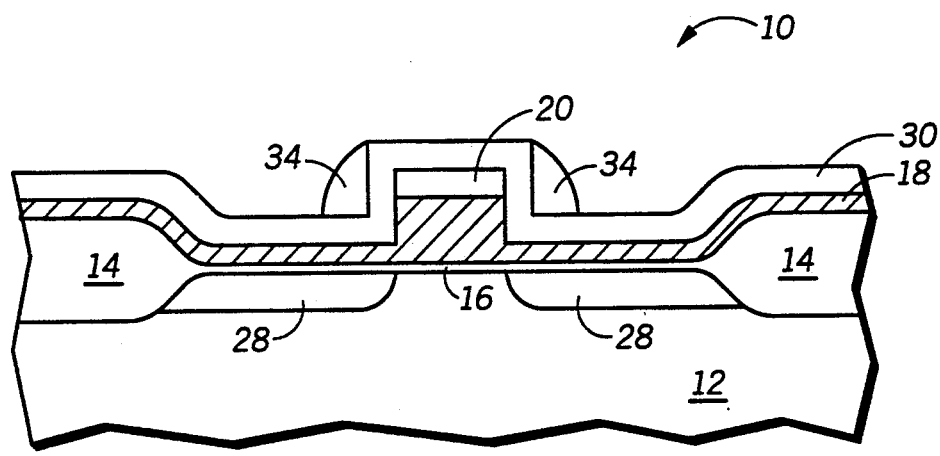

Next, an insulating layer 30 is deposited on device 10, as depicted in FIG. 5. Insulating layer 30 may be formed of TEOS, $SiO_2$, or the like. As an example, insulating layer 30 is about 500 Å (50 nm) thick. A spacer material 32 is deposited on insulating layer 30. Spacer material 32 is preferably of a material which can be etched selectively to insulating layer 30. For example, if insulating layer 30 is TEOS, spacer material 32 can be $Si_3N_4$. Spacer material 32 is deposited to a thickness which is sufficient to form sidewall spacers 34, as illustrated in FIG. 6. Sidewall spacers 34 are formed in a conventional manner by, for example, RIE (reactive ion etching) of spacer material 32.

Figure 7:
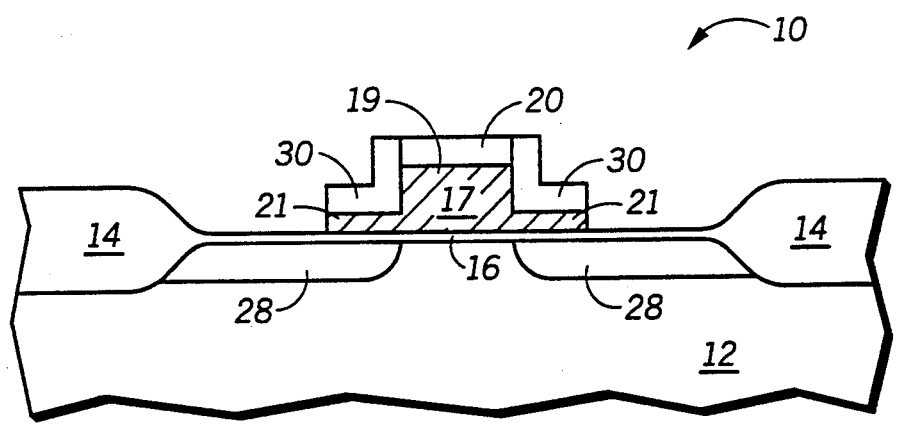

Sidewall spacers 34 act as an etch mask during subsequent processing. After forming the spacers, device 10 is subjected to an etch to remove portions of insulating layer 30 and conductive layer 18 which are not protected by the sidewall spacers. In etching the insulating and conductive layers, a series of etches may be used to remove one layer at a time or the etch may be accomplished in an etch system having the ability to etch both layers of material simultaneously, stopping on gate dielectric 16. Following the etch, the sidewall spacers are removed, as illustrated in FIG. 7. As a result of etching the insulating layer 30 and conductive layer 18, an inverse-T gate electrode 17 is formed in device 10. The gate electrode includes shelf portions 21 and a body portion 19. With respect to the previous discussion on thickness, body portion 19 has a thickness equal to the original thickness of conductive layer 18, namely T1 from FIG. 1. Shelf portions 21 have a thickness of (T1−T2), or the thickness of conductive layer 18 minus the thickness of layer of material 22.

Figure 8:
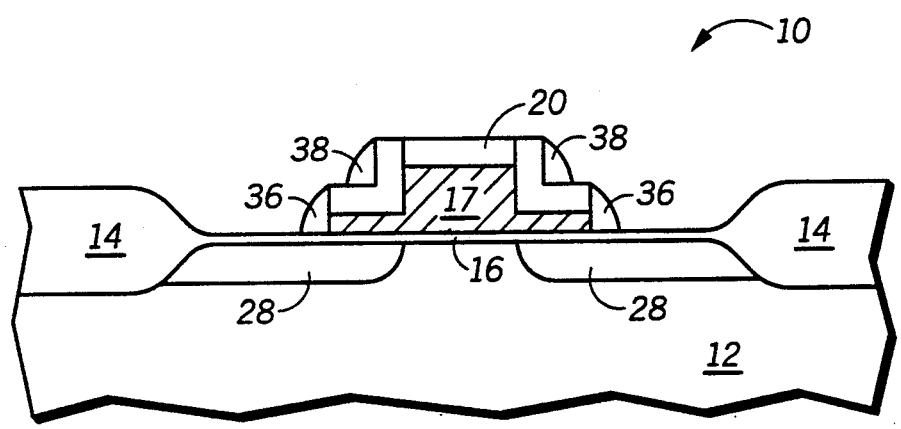

As FIG. 7 also illustrates, remaining portions of insulating layer 30, as well as insulating layer 20, cover a majority of gate electrode 17. Sides of shelf portions 21 which remain exposed must also be insulated. Insulating the shelf sides may be accomplished by depositing a layer of material (not shown) and forming sidewall spacers 36 and 38, as illustrated in FIG. 8, using a conventional method. As an example, sidewall spacers 36 and 38 can be formed of $Si_3N_4$.

Figure 9:
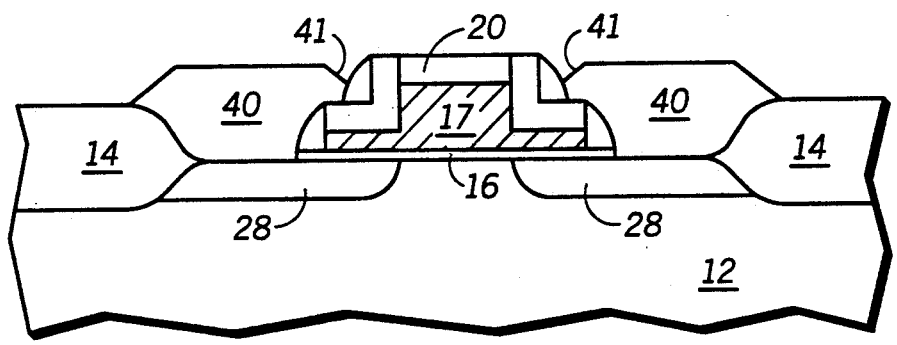

After gate electrode 17 is completely insulated, device 10 is subjected to a short etch to remove exposed portions of gate dielectric 16 which lie above LDD regions 28. Removal of the gate dielectric exposes portions of substrate 12 in which LDD regions 28 are formed. Exposing portions of substrate 12 permits formation of a pair of current electrodes 40, one of which functions as a source electrode and the other as a drain electrode, by selective deposition, as illustrated in FIG. 9. In the case that substrate 12 is silicon, exposed portions of the substrate act as a nucleation site for deposition of either monocrystalline or polycrystalline silicon to form current electrodes 40. With continued deposition, the selectively deposited silicon itself acts a nucleating site so that additional silicon deposits on earlier deposits to extend the current electrodes upward. Selectively deposited silicon does not deposit on oxides or other dielectric materials; however, lateral growth of selectively deposited silicon allows current electrodes 40 to extend over shelf portions of inverse-T gate electrode 17 and also over portions of field oxide regions 14, as indicated in FIG. 9.

While selective deposition has previously been proposed for use in semiconductor devices, one problem with using selective deposition, particularly selective deposition of monocrystalline materials, is that facets form in the selectively deposited material. In FIG. 9, current electrodes 40 have facets 41. Facets are formed because monocrystalline materials have a crystallographic orientation such that growth or deposition is preferred in only a few directions. In existing semiconductor devices which utilize selective deposition techniques, the facets create irregular doping profiles in an underlying substrate. Because the thickness of a selectively deposited material is thinner underneath faceted regions, dopants can penetrate the faceted regions and reach the underlying substrate more easily than in other portions of the selectively deposited material. Thus, doping profiles in the substrate layers of many known semiconductor devices which utilize selectively deposited electrodes have peaks beneath the facets, causing non-uniform junctions.

Figure 10:
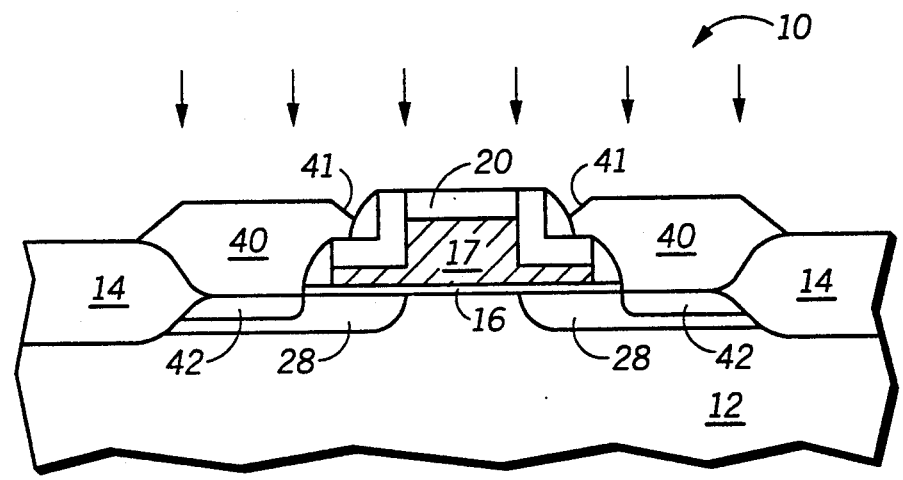

With the present invention, facets 41 of the selectively deposited current electrodes 40 do not interfere with doping profiles. As illustrated in FIG. 10, device 10 is subjected to a high dose implant to dope current electrodes 40 and to form heavily doped regions 42 within LDD regions 28. Because facets 41 are formed over the shelf portions of gate electrode 17, the facets do not interfere with doping of substrate 12, allowing heavily doped regions 42 to have a uniform doping profile, as indicated in FIG. 10. In forming an N-channel transistor, the doping would employ an N-type dopant species, while a P-channel transistor would use a P-type dopant species. Dosages suitable for doping current electrodes 40 are comparable to those used in other transistor structures.

Figure 11:
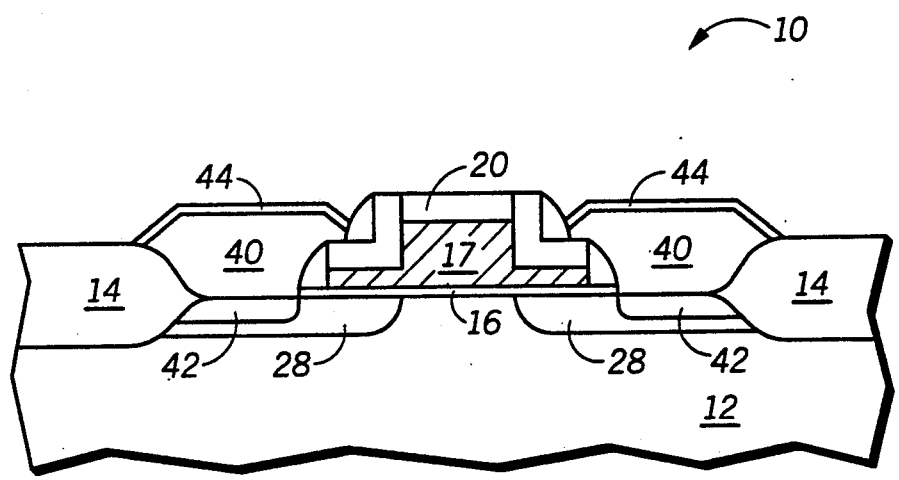

An additional fabrication step which may be used in accordance with the present invention is silicidation of current electrodes 40, as illustrated in FIG. 11. Silicidation is accomplished using any known technique, such as by depositing a refractory metal (titanium or cobalt) on the device and thermally reacting the metal with exposed silicon current electrodes to form silicide regions 44. Silicide regions 44 reduce contact resistance between current electrodes 40 and subsequently formed contacts (not shown) to the current electrodes. After forming current electrodes 40 by selective deposition, whether or not the current electrodes are silicided, device 10 then undergoes remaining processing steps to complete fabrication of the device.

Many of the disadvantages of existing semiconductor devices mentioned earlier are overcome by the present invention. For example, a low lateral electric field is achieved by the invention because LDD regions are used. Furthermore, since the LDD regions in the present invention lie partially beneath a gate electrode, the electric field and source-drain series resistance is lower in comparison to known LDD structures. Yet another advantage of the present invention is that the benefits of an inverse-T gate are achieved while a smaller amount of layout space is required than if using conventional inverse-T structures. The reduction in layout space is made possible by employing elevated source and drain electrodes, formed by selective deposition, which partially overlap shelf portions of the inverse-T gate electrode. Moreover, the employment of the overlapped and elevated source and drain electrodes overcomes existing problems associated with elevated source and drain regions. In particular, irregular doping profiles and non-uniform junctions usually created by doping selectively deposited monocrystalline material are avoided in the present invention because facets of the source and drain electrodes are formed above shelf regions of the inverse-T gate electrode. Another benefit of the present invention is that the elevated source and drain electrodes permit easier source and drain contact formation. The contact area of elevated source and drain electrodes is larger than if the source and drain electrodes were formed in the substrate due to lateral growth during selective deposition.

Thus it is apparent that there has been provided, in accordance with the invention, a semiconductor device having an MOS transistor with elevated source and drain regions and a process for making the same that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention is not limited to the fabrication methods described and illustrated in FIGS. 1-11. Several fabrication alternatives exist. One alternative is that LDD regions may be formed by aligning the LDD regions to edges of shelf portions of an inverse-T gate electrode rather than aligning the LDD regions to a body portion of the gate electrode. Shelf-aligned LDD regions may be formed at a stage in the fabrication comparable to that illustrated in FIG. 7, as opposed to body-aligned LDD regions which are formed in FIG. 4. In addition, the invention is not limited to using those materials specifically mentioned or the thicknesses listed for these materials. Materials and thickness described are given only as workable examples. It is also important to note that the present invention may be practiced using both N-channel and P-channel transistors. Therefore, it is intended that this invention encompass all such variations and modifications as fall within the scope of the appended claims.

I claim:

1. A semiconductor device having a MOS transistor with
   an overlapped and elevated source and drain, comprising:
   a silicon substrate;
   an inverse-T gate electrode overlying the substrate and separated from the substrate by a gate dielectric, the inverse-T gate electrode having a body portion and first and second shelf portions;
   first and second lightly doped regions of a first conductivity formed in the substrate on opposing sides of the inverse-T gate electrode;
   an elevated, single crystalline silicon source electrode of the first conductivity formed on the first lightly doped region;
   an elevated, single crystalline silicon drain electrode of the first conductivity formed on the second lightly doped region; and
   a dielectric separating the elevated source electrode and elevated drain electrode from the inverse-T gate electrode;
   wherein the source electrode and the drain electrode each have a facet along a predetermined, non-vertical, and non-horizontal crystallographic plane; and
   wherein the facet of the source electrode overlies the first shelf portion and the facet of the drain electrode overlies the second shelf portion.

2. The semiconductor device of claim 1 wherein the first and second lightly doped regions underlie the first and second shelf portions of the inverse-T gate electrode.

3. The semiconductor device of claim 2 wherein the source electrode and drain electrode are formed from selectively grown silicon.

4. The semiconductor device of claim 2 wherein the dielectric comprises dielectric sidewall spacers.

5. A semiconductor device having an MOS transistor with an elevated and overlapped source and drain, comprising:
   a semiconductor substrate having first and second lightly doped regions of a first conductivity formed therein;
   a channel region in the substrate adjoining the first and second lightly doped regions;
   an inverse-T gate electrode formed over the substrate having a body portion and first and second shelf portions, the body portion overlying the channel region and the first and second shelf portions overlying the first and second lightly doped regions, respectively;
   a gate dielectric separating the inverse-T gate electrode and the substrate;
   a source electrode and a drain electrode formed above the first and second lightly doped regions, respectively, the source and drain electrodes each being of a single crystalline material and each having a non-vertical and non-horizontal faceted edge along a predetermined crystallographic plane of the single crystalline material, wherein the faceted edge of the source electrode overlies the first shelf portion of the gate electrode and the faceted edge of the drain electrode overlies the second shelf portion of the gate electrode; and
   one or more dielectric materials electrically isolating the inverse-T gate electrode from the source and drain electrodes.

6. The semiconductor device of claim 5 wherein the semiconductor substrate and the source and drain electrodes are of silicon.

7. The semiconductor device of claim 2 wherein the dielectric comprises a dielectric layer which conforms to the first and second shelf portions and the body portion of the gate electrode.

8. The semiconductor device of claim 2 wherein the dielectric comprises a combination of dielectric sidewall spacers and a dielectric layer which conforms to the first and second shelf portions and the body portion of the gate electrode.

9. The semiconductor device of claim 5 wherein the one or more dielectric materials comprises dielectric sidewall spacers.

10. The semiconductor device of claim 5 wherein the one or more dielectric materials comprises a dielectric layer which conforms to the first and second shelf portions and the body portion of the gate electrode.

11. The semiconductor device of claim 5 wherein the one or more dielectric materials comprises a combination of dielectric sidewall spacers and a dielectric layer which conforms to the first and second shelf portions and the body portion of the gate electrode.

12. A semiconductor device having an MOS transistor with an elevated and overlapped source and drain, comprising:
   a silicon substrate having first and second doped regions formed therein;
   a channel region in the substrate adjoining the first and second doped regions;
   a field isolation region adjacent each of the first and second doped regions;
   a inverse-T gate electrode formed over the substrate having a body portion and first and second shelf portions, the body portion overlying the channel region and the first and second shelf portions partially overlying the first and second doped regions, wherein the first and second shelf portions and the body portion of the gate electrode are each formed of polysilicon;
   a gate dielectric separating the inverse-T gate electrode and the substrate;

a source electrode of single crystalline silicon formed on the first doped region, the source electrode having a first and a second faceted edge each formed along a crystallographic plane of the silicon, the first faceted edge overlying the first shelf portion of the gate electrode and the second faceted edge overlying the field isolation region adjacent the first doped region;

a drain electrode of single crystalline silicon formed on the second doped region, the drain electrode having a first and a second faceted edge each formed along a crystallographic plane of the silicon, the first faceted edge overlying the second shelf portion of the gate electrode and the second faceted edge overlying the field isolation region adjacent the second doped region; and one or more dielectric materials electrically isolating the inverse-T gate electrode from the source and drain electrodes.

13. The semiconductor device of claim 12 wherein the first and second shelf portions and the body portion of the gate electrode together are formed from a single layer of polysilicon.

* * * * *